United States Patent [19]

Bouteille et al.

[11] 4,194,533
[45] Mar. 25, 1980

[54] CONTROL CIRCUIT FOR PNEUMATIC SHIFT REGISTER

[75] Inventors: Daniel Bouteille, Marnes la Coquette; Andre Thomasse, Pacy-sur-Eure; Eric Petrimaux, Evreux, all of France

[73] Assignee: La Telemecanique Electrique, Pacy-sur-Eure, France

[21] Appl. No.: 787,662

[22] Filed: Apr. 14, 1977

[51] Int. Cl.² ............................................. F16K 37/00
[52] U.S. Cl. .............................. 137/624.18; 137/553; 235/201 ME
[58] Field of Search ............... 137/624.13, 624.15, 137/624.18, 624.2, 553, 804, 818, 819, 821, 119; 235/201 R, 201 ME, 201 FS, 201 PF

[56] References Cited

U.S. PATENT DOCUMENTS

| 2,965,134 | 12/1960 | Pouppirt, Jr. | 137/624.18 |
| 3,250,470 | 5/1966 | Grubb | 235/201 PF |
| 3,364,342 | 1/1968 | Jakubowski | 235/201 FS |
| 3,410,312 | 11/1968 | Cogar | 235/201 PF |
| 3,561,676 | 2/1971 | Amos | 235/201 PF |
| 3,621,264 | 11/1971 | Bonnèric | 137/624.15 |
| 3,633,392 | 1/1972 | Bell | 235/201 PF |
| 3,720,232 | 3/1973 | Corliss et al. | 137/624.15 |
| 3,732,892 | 5/1973 | Bubula | 137/821 |
| 3,797,537 | 3/1974 | Faessler et al. | 137/804 |
| 3,821,537 | 6/1974 | O'Keefe | 235/201 PF |
| 3,875,959 | 4/1975 | Bouteille | 235/201 ME |

FOREIGN PATENT DOCUMENTS 2149322 3/1973 France .

Primary Examiner—William R. Cline
Assistant Examiner—H. Jay Spiegel
Attorney, Agent, or Firm—William Drucker

[57] ABSTRACT

The invention provides a control circuit for a pneumatic shift register constituted by phase cells associated with an assembly of two threshold relays, each having a supply input and a control input which inhibits the output when the pressure that it receives is not lower than a pressure threshold which is low with respect to the control threshold of the memory contained in the cell.

4 Claims, 4 Drawing Figures

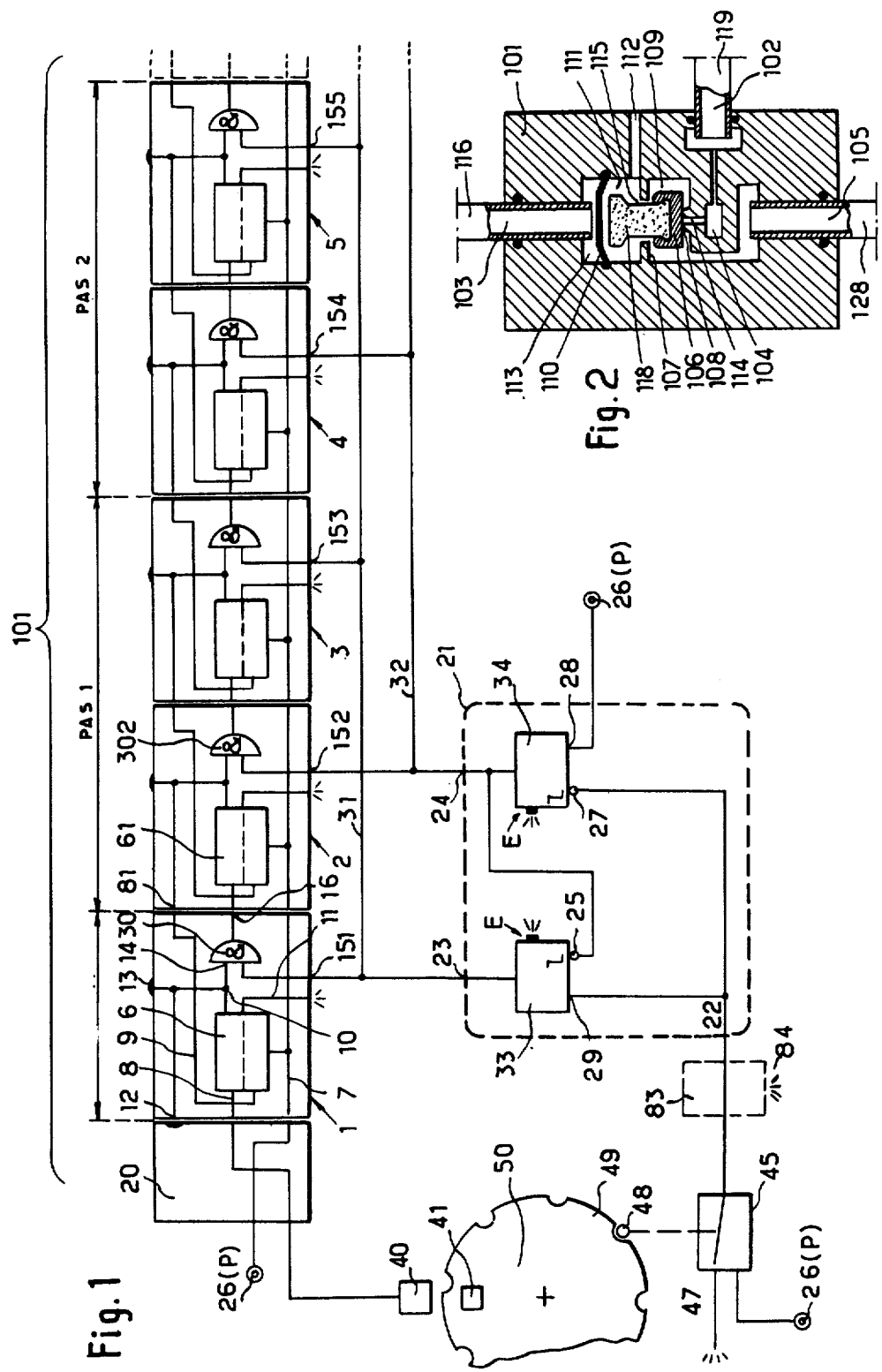

CONTROL CIRCUIT FOR PNEUMATIC SHIFT REGISTER

The present invention relates to a control circuit for a pneumatic shift register where said latter is represented by the association in series of phase cells, each containing a pneumatic AND gate and a magnetic bistable pneumatic memory of the type described in French Patent Application No. 71 30746 filed on Aug. 18, 1971 in the name of Daniel Bouteille, entitled "Pneumatic memory relay with magnetic synchronization", each step of the register being represented by two adjacent cells (an odd row cell and an even row cell) and where the advance of a signal present at one of the cells is obtained by alternative application of a control pressure on the input orifices of all the AND gates belonging to the odd row cells, then on those which belong to the even row cells.

An embodiment of such a register is given in Applicants' copending U.S. Patent application entitled "Control circuit for pneumatic phase cell and module for execution thereof", where a solution is presented which remedies the poor functioning resulting from the slow disappearance of the pressure on the even and odd lines.

In the solution presented, use is made of a two-way distributor alternately supplying the even and odd lines, as well as of phase cells each comprising a supplementary inhibition AND gate so that the cost of such an assembly may become high if the number of steps of the register is high.

It is an object of the invention to propose another solution to the problems caused on the one hand by the non-instantaneous disappearance of the pressure whose existence may be translated by a non-controlled advance of the register, and on the other hand by the use of fluid interrupters which are less complicated than the two-way distributors.

According to the invention, the result is obtained due to the fact that the odd line and the even line are connected respectively to the output of a first and a second pneumatic threshold relay, each presenting in addition a supply input and a control input, this latter causing the connection between the supply input and the output when the pressure prevailing therein becomes lower than a pressure threshold clearly lower than the control pressure of the memory, and due to the fact that the even line is connected to the control input of the first relay, and a permanent pressure is applied to the supply input of the second relay, whilst the control input of the second relay and the supply input of the first relay are connected to the output of a pressure interrupter delivering a pressure signal in the form of a pulse developing between a supply pressure and an exhaust pressure.

The invention will be more readily understood on reading the following description with reference to the accompanying drawings, in which:

FIG. 1 schematically shows the arrangement of the shift register which is associated in non-limiting manner with a control equipment.

FIG. 2 illustrates an embodiment of the low de-control threshold relay.

Figure 4:
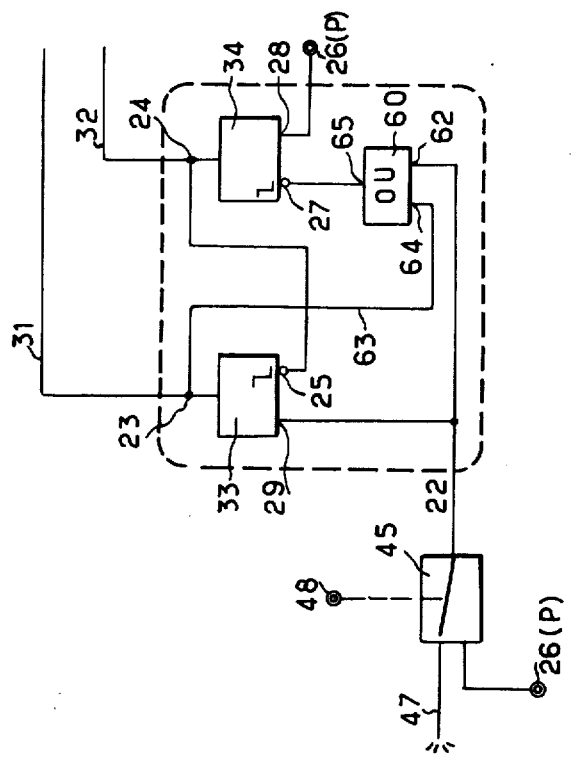
FIG. 4 illustrates a variant assembly.

Referring now to the drawings, FIG. 1 shows a shift register 101 which is mainly constituted by an assembly of phase cells such as 1, 2, 3, 4, 5 ... in which each phase cell, comprising a bistable memory 6 whose positions are stabilised magnetically, and an AND gate 30 corresponds to the constitution which is described in French Pat. No. 71 35894 filed on Sept. 29, 1971 in the name of Daniel Bouteille, for "Components for producing pneumatic logic units".

This memory is connected to a permanent supply conduit 7, to a conduit 8 for placing in logic state "1", and a conduit 9 for returning to logic state "0", and presents an output conduit 10 where the logic states will be exploited as well as an exhaust conduit 11; the output of the memory is connected to a reset orifice 12, to an output orifice 13 which will be obturated for this application, and to one of the inputs 14 of a pneumatic AND gate 30, the other input of which, the so-called discharge input, is connected to the orifice 151, 152, ... ; the output of the AND gate terminates in its turn at an orifice 16 delivering an advance signal when the AND gate is in the pass state. A member 20 placed at the left end of the register effects the closure of the orifice 12 of the first cell, connects the supply conduit 7 to a permanent source of pressure 26 and connects the channel 8 to a pneumatic signal source 40 becoming active upon the appearance of a certain phenomenon.

The discharge orifices 151, 152, 153 ... of the following cells are connected, according to whether they belong to odd row cells or even row cells, to an odd conduit 31 and to an even conduit 32 respectively.

The assembly 21 represents, surrounded by a broken-lined rectangle, a pneumatic logic circuit presenting a signal input channel 22 and two signal outputs 23, 24, constituting a circuit which alternately energizes the even and odd lines with the aid of a simple reverser whilst ensuring the functional reliability.

The input 22 is connected to a single pneumatic reverser 45 which may connect said input to the source of permanent pressure 26 or to the exhaust 47 to supply a short pulse when the member 48 actuating the reverser is urged by one of the cams 49 of an apparatus 50 advancing by a step-by-step movement.

The outputs 23, 24 of the circuit 21 are connected respectively to the odd and even conduits defined hereinabove.

Inside the assembly 21 are disposed two threshold relays 33, 34. Each of these relays possesses a supply input 28, 29 respectively and a control input 27, 25, respectively, the first being adapted to receive a relatively high supply pressure which will be conducted towards the respective outputs 23, 24 of the relays when the control pressure on the control inputs will become lower than a substantially lower pressure threshold than the supply pressure.

Conduits placed between these different gates make the following connections, as may be seen in the Figure:

the output of the first threshold relay 33 is connected to the output 23 and to the odd line 31;

the output of the second threshold relay 34 is connected to the output 24 and to the even line 32;

the control input 25 of the first relay is connected to the output of the second relay 34;

the input 28 of the second relay is connected to the permanent pressure 26;

the input 29 of the first relay 33 and the control input 27 of the second relay are connected to the input 22 of the assembly, and subsequently connected to the output of the reverser 45.

The constitution of each relay is such that when said latter is in the pass state and in its stable state, its output is connected to the permanent pressure and when said latter is in the non-pass state, the output is connected to an exhaust orifice E.

The functioning of the shift register is explained as follows: When a pressure signal coming from the observation probe 40 is presented at the input 8 on the first phase cell 1, called inscription cell, for example due to the detection of a defective part 41, the memory 6 takes its logic "1" state; at the moment when this observation is made, the interrupter 45 is not actuated by one of the cams 49 of the mobile step-by-step plate 50 of the machine and consequently no pressure signal is applied to the input 22, this rendering the threshold relay 33 non-pass and on the contrary provoking the pass state of relay 34.

The odd line is consequently without pressure, the opposite of the even line.

This results in the AND gate 30 of the first phase cell which receives solely a signal coming from the memory remaining in the non-pass state and being in its state of inscription.

The transfer or advance of the data received is produced at the moment when, the plate beginning to move, the interrupter 45 applies a pressure on the assembly 21 and the odd line is placed under pressure, whilst the even line loses its pressure; the AND gate 30 then becomes pass and causes the memory 61 of the phase cell 2 to flip to the logic state "1" whose output 81 resets the preceding memory to the logic "0" state.

It is observed that, if at the moment of this transfer, the AND gate 302 is activated on its input 152 by a sufficient residual pressure, the register will very quickly transfer its contents to the adjacent cell 3.

This possibility is excluded due to the locking circuit 21 which operates in the following manner by taking for original conditions the connection of the input 22 to the exhaust 47 of the interrupter and consequently the existence of a pressure established on the even line 32 and the total absence of pressure on the odd line 31:

when the rotation of the plate 50 causes the actuation of the interrupter 45, said latter transmits a pressure to the input 22 which is on the one hand communicated to the input 29 of the relay 33 without provoking an output signal, since the pressure at 25 being the same as at 24 and at 32, the output is inhibited, and on the other hand communicated to the input 27 of the relay 34 which takes its blocked state, when a certain pressure threshold, called control threshold, is reached, this threshold being higher than the de-control threshold defined previously. At the moment when the pressure drops on the output 24 by internal connection thereof to the exhaust E of the gate 34, until the de-control threshold is reached, the input 25 of the gate 33 allows the pass state of said latter and consequently causes the odd line 31 to be placed under pressure by connection of this latter with input 22;

when the plate having rotated by a sufficient amount to de-actuate the interrupter 45, the conduit 22 is connected to exhaust 47, the odd line is firstly purged through the conduit 22 peculiar to the relay 33, then through the exhaust E at the moment when the pressure at the input 22 having become equal to or lower than the de-control threshold, the input 27 of the gate 34 allows the transmission of the fluid coming from the permanent supply 26, to the even line 32 and consequently provokes the application of an inhibition signal to the input 25 of the relay 33, thus confirming the zero pressurisation of conduit 31.

The development of the pressure on the channels 22, 31 and 32 is given in FIG. 3 which will be referred to hereinbelow.

The material production of a threshold relay such as 33 or 34 is found in FIG. 2 where 101 shows the body provided with orifices 102, 103 and 105, corresponding respectively to the inputs and outputs 28-29, 25-27, 23-24 of the preceding Figure.

The interior of the body mainly comprises a valve 106 movable between two seats 107 and 108 in a first chamber 109 connected to orifice 105. A deformable membrane 110 is placed between a second chamber 111 terminating at the orifice of the first seat and connected to the exhaust 112 on the one hand and a third chamber 113 connected to the orifice 103 on the other hand, whilst a conduit connects the orifice 102 to a chamber 104 where a calibrated opening 114, which is that of the seat 108, places chambers 104 and 109 in communication. An opening 115 also connects the chambers 111 and 113, at the level of the seat 107, and allows a push-rod 118 which passes therethrough to be placed in position.

The membrane 110 is sufficiently supple to actuate the push-rod 118 fast with the valve 106 in the direction of closure of the seat 108 if a sufficient pressure appears in chamber 113.

The supple tubes 128, 119 and 116 are maintained in place by annular clamps (not shown), the gripping members of which hold their periphery, whilst the seal is ensured by O-rings.

Figure 3:
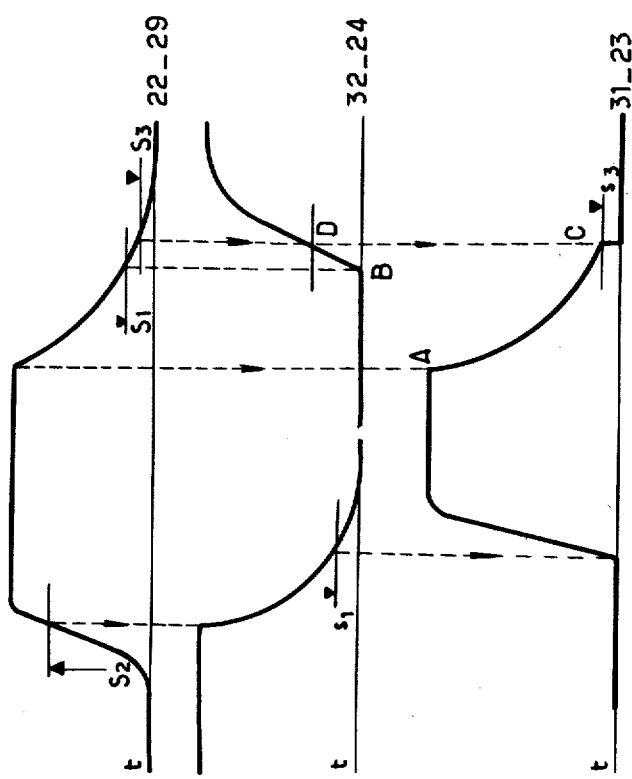
FIG. 3 shows the curve of the pressure variations in the circuit according to the invention.

The functioning of the relay, to be compared with the developments of pressure shown in FIG. 3 is as follows.

If two high pressures are present simultaneously on inputs 102 and 103 (FIG. 2), the diameter of the membrane 110 being larger than that of the opening 114, the valve 106 closes said latter. If the pressure prevailing on control input 103 reduces until it reaches a certain threshold $S_1$, called de-control threshold, the valve 106 is displaced upwardly in the Figure and a passage of fluid is operated between the supply input 102 and the output 105.

The de-control threshold is determined by the ratio of the diameters of the orifice 114 and the membrane 110, as well as by the ratio of the pressures prevailing at 103 and 102.

On the contrary, the pressure being maintained at 102, the pressure at orifice 3 must reach a certain value, higher than the de-control pressure (which is the control threshold $S_2$), in order that the valve takes a lower position and that the output 105 no longer receives pressure, the threshold $S_2$ now being determined by the ratio of the diameters of the membrane 110 and of the seat 107.

When the pressure at 103 reduces, the valve will lift only for the very low pressure determined by the ratio of the opening 114 to that of the membrane 110.

Although the constitution of the two threshold relays 33, 34 is the same and corresponds to that which is illustrated in FIG. 2, their functioning is not identical since the first relay 33 receives variable pressure signals on its two inputs, whilst the second relay 34 receives on its first input 28 a signal of maintained pressure.

The functioning of the relay in its position 34 of FIG. 1 is as follows, in the light of FIG. 3. Assuming that the input 102 or 28 respectively is supplied with pressure, the following phenomena occur: in the absence of signal on orifice 103 (input 27), the connection is established between the orifice 102 (input 28) and the orifice 105

(output 24); when the pressure increases at orifice 103 (27) up to a value $S_2$ determined by the values of P (permanent pressure) and the ratio of the surfaces of the membrane and the seat 7, the valve interrupts the connection between the input 102 (28) and the output 105 (24). This value $S_2$ is called the "control threshold".

When the pressure P being maintained at orifice 102 (28) the pressure applied at 103 (27) drops, the valve 106 will lift to allow the connection of the input 102 (28) and the output 105 (24), only for a value $S_1$ which is low due to the ratio of the respective surfaces of the membrane and the orifice 114 of the seat 108. This value $S_1$ which is lower than $S_2$ is called the "de-control threshold".

The functioning of the relay 33 depends on the relative development of the pressures applied to the inputs 25 and 29, thus to the orifices 103 and 102 of FIG. 2.

The various phases may be seen in FIG. 3 where the proportions between the transitory and permanent phenomena have been exaggerated.

When the first input 29 (102) (FIGS. 2 and 1) is under pressure and the pressure appears or disappears on the second input 25 (103), the functioning is identical to that described for relay 34.

On the contrary, if the pressure at 29 (102) drops from a high value (point A) before the pressure at 25 (103) increases from a zero value (point B), there is firstly a purge of the output 23 (105), thus of the conduit 31 which was under pressure towards the input 29 (102); when the difference in pressure between the input 29, which is the same as that of the output 23 (points C and D), and the pressure at 25, reaches a certain value, the valve obturates the seat 108 to connect the output 23 to exhaust E (112), this provoking an acceleration of the purge of the conduit 31 and confirming the non-pass state of the relay 33.

The conduit 31 consequently cannot, at this moment, present a pressure higher than the threshold $S_1$, since, at the moment when points C and D appear, the residual pressure $S_3$, on line 22, which is the same as the pressure at point C on line 31, is already lower than threshold $S_1$. A supplementary improvement to the circuit which has just been described consists, according to FIG. 4, in transmitting the signal of the interrupter 45 to the second input 27 of the second relay 34 via an OR gate 60, to an output 65 and to two inputs, the first input 62 being connected to the input conduit 22 and the second input 64 being placed in communication with the output of the first AND relay 33 via conduit 63.

The functioning of this latter circuit is the same as that of the preceding circuit during the period of rise in pressure of line 22 because, at this moment, the conduit 23 being under pressure, the OR gate behaves as a direct conduit.

When the conduit 23 has been placed under pressure, the signal applied to conduit 63 confirms the pass state of the OR gate.

However, when the conduit 22 is purged during the de-actuation of the interrupter 45, there could be a residual pressure in the conduit 23, 31, in the case of FIG. 1, at the moment when the relay 34 becomes pass, for example if the de-control threshold of this latter were greater than its normal value, or if the portion of conduit 22 terminating at input 27 was purged more quickly than the one terminating at input 29.

Due to the OR gate 60, any residual pressure in the conduit 23, 31 is applied to the relay 34 to inhibit its opening and consequently avoid any simultaneous pressure on line 24.

When it is desired to increase the rapidity of transfer of the register, the interrupter 45 must deliver shorter and closer pressure pulses which render necessary a more rapid purge of the conduits, in particular that of the odd conduit. To this end, a signal regenerator circuit 83, known per se, (FIG. 1), may be used, on the conduit placed between the interrupter 45 and the inputs 22 of the threshold relays 33, 34, and near these latter, this regenerator circuit comprising an exhaust opening 84 enabling the fraction of conduit 22, 23, 31 included between it and the inputs of the AND gates of the phase cells to be rapidly purged.

What is claimed is:

1. A pneumatic shift register comprising: a plurality of cascade-mounted alternately odd and even phase cells, each comprising a bistable pneumatic memory having a set input adapted to set said memory to a logic state 1 when a predetermined pressure is applied thereon, a reset input, an exhaust, a supply pressure input and an output, each phase cell further comprising a pneumatic AND-gate having first and second inputs and an output, the first input of the AND-gate being connected to the output of the memory, the output of each memory being connected to the reset input of the memory of the preceeding phase cell, the output of each AND-gate being connected to the set input of the memory of the succeeding phase cell; a first shift control line connecting the second inputs of the AND-gates of the odd phase cells; a second shift control line, connecting the second inputs of the AND-gates of the even phase cells; and means for alternately supplying said first and second shift control lines with pneumatic pressure pulses, said pressure pulse supplying means comprising first and second pneumatic threshold relays having each a fluid supply input, a fluid control input and an output, the outputs of the first and second pneumatic threshold relays being respectively connected to the first and second shift control lines; a third pneumatic shift control line connected to the supply input of the first relay and to the control input of the second relay; shift pressure pulse generating means connected to the said third pneumatic shift control line, said pressure pulses having a first exhaust pressure level and a second supply pressure level which is higher than said predetermined pressure, the control input of the first relay being connected to the output of the second relay, a source of permanent pressure supply connected to the supply input of the second relay, said threshold relays being arranged for providing an output signal only when the pressure at the control input thereof is less than a threshold value which is substantially lower than said predetermined pressure.

2. A pneumatic shift register according to claim 1, said shift register further comprising a pneumatic OR-gate having first and second control inputs and an output; the first shift control line and the third shift control line being respectively connected to the said first and second control inputs, and the output of the OR-gate being connected to the control input of the second relay.

3. A pneumatic shift register according to claim 2, wherein each of said first and second threshold relays has a hollow body forming an internal cavity and first, second, third and fourth conduits respectively connecting said internal cavity to the said fluid supply input, the said fluid control input to the said output and to an exhaust respectively; a valve seat, having an aperture, said valve seat defining, within the said internal cavity, a first chamber in communication with the first and third conduits, the communication between the first chamber and the first conduit being effected through a channel of predetermined cross-section, a deformable membrane defining, within the said internal cavity, a second chamber in communication with the fourth conduit and a third chamber in communication with the second conduit; a valve-means mounted within first chamber and movable from a rest position in which said valve-means closes the said aperture and allows communication between the first conduit and the first chamber and an active position in which said valve-means inhibits the said communication and opens the said aperture, said valve means having a push member projecting through the said aperture and co-operating with said deformable membrane, the area of the cross-section of the said channel being lower than the area of the said aperture, which is in turn lower than the area of the deformable membrane.

4. A pneumatic shift register according to claim 1, wherein each of said first and second threshold relays has a hollow body forming an internal cavity and first, second, third and fourth conduits respectively connecting said internal cavity to the said fluid supply input, the said fluid control input to the said output and to an exhaust respectively; a valve seat, having an aperture, said valve seat defining, within the said internal cavity, a first chamber in communication with the first and third conduits, the communication between the first chamber and the first conduit being effected through a channel of predetermined cross-section, a deformable membrane defining, within the said internal cavity, a second chamber in communication with the fourth conduit and a third chamber in communication with the second conduit; a valve-means, mounted within the first chamber and movable from a rest position in which said valve-means closes the said aperture and allows communication between the first conduit and the first chamber and an active position in which said valve means inhibits the said communication and opens the said aperture, said valve means having a push member projecting through the said aperture and co-operating with said deformable membrane, the area of the cross-section of the said channel being lower than the area of the said aperture, which is in turn lower than the area of the deformable membrane.

* * * * *